United States Patent

Griswold et al.

(10) Patent No.: US 9,030,726 B2
(45) Date of Patent: May 12, 2015

(54) ACOUSTO-OPTIC MODULATOR FOR MULTI-LAYER DISPLAY

(75) Inventors: Chauncey W. Griswold, Reno, NV (US); Stewart Thoeni, Reno, NV (US); Jean Pierre LeGras, Carson City, NV (US); Charles W. Johnson, Reno, NV (US)

(73) Assignee: IGT, Las Vegas, NV (US)

( * ) Notice: Subject to any disclaimer, the term of this patent is extended or adjusted under 35 U.S.C. 154(b) by 431 days.

(21) Appl. No.: 13/480,871

(22) Filed: May 25, 2012

(65) Prior Publication Data

US 2013/0316814 A1  Nov. 28, 2013

(51) Int. Cl.
| | | |
|---|---|---|
| G02F 1/11 | (2006.01) | |
| G07F 17/32 | (2006.01) | |
| G02F 1/1347 | (2006.01) | |
| G02F 1/33 | (2006.01) | |
| H01L 41/09 | (2006.01) | |
| G02F 1/1333 | (2006.01) | |

(52) U.S. Cl.
CPC ............ *G07F 17/3211* (2013.01); *Y10T 29/42* (2015.01); *H01L 41/09* (2013.01); *G02F 1/113* (2013.01); *G02F 1/1347* (2013.01); *G02F 1/33* (2013.01); *G02F 2001/133394* (2013.01); *G02F 2201/44* (2013.01)

(58) Field of Classification Search
CPC ........................................................ G02F 1/11
USPC ......... 359/285, 240, 238, 237, 305, 445, 579, 359/901, 311, 312, 900; 29/25.35; 463/20, 463/30, 31, 32
See application file for complete search history.

(56) References Cited

U.S. PATENT DOCUMENTS

| | | | |
|---|---|---|---|
| 7,230,316 B2 * | 6/2007 | Yamazaki et al. | ............ 257/531 |
| 7,573,822 B1 | 8/2009 | Monk et al. | |
| 7,742,124 B2 | 6/2010 | Bell | |
| 8,012,010 B2 | 9/2011 | Wilson et al. | |
| 8,241,124 B2 * | 8/2012 | Kelly et al. | ..................... 463/34 |
| 2008/0020841 A1 | 1/2008 | Wells et al. | |
| 2008/0113745 A1 | 5/2008 | Williams et al. | |
| 2008/0113749 A1 | 5/2008 | Williams et al. | |
| 2008/0113756 A1 | 5/2008 | Williams et al. | |
| 2008/0113775 A1 | 5/2008 | Williams et al. | |
| 2008/0132313 A1 * | 6/2008 | Rasmussen et al. | ............ 463/16 |
| 2008/0136741 A1 | 6/2008 | Williams et al. | |
| 2009/0036208 A1 | 2/2009 | Pennington et al. | |
| 2009/0061984 A1 | 3/2009 | Yi | |
| 2009/0079667 A1 | 3/2009 | Schlottmann et al. | |
| 2009/0082083 A1 | 3/2009 | Wilson et al. | |
| 2009/0104954 A1 | 4/2009 | Weber et al. | |

(Continued)

OTHER PUBLICATIONS

Bell et al., "Beyond Flat Panels—Multi Layer Displays with Real Depth," Symposium Digest of Technical Papers, May 2008, vol. 39, Issue 1, pp. 352-355.

*Primary Examiner* — Tuyen Tra
(74) *Attorney, Agent, or Firm* — Neal, Gerber & Eisenberg LLP

(57) ABSTRACT

A gaming system including an electronic gaming machine (EGM) having a multi-layer display is described. In particular, the EGM can be configured with a display that provides a 3D-like image. An acousto-optical modulator interstitial component can be positioned between two liquid crystal displays to mitigate moiré interference. A piezoelectric transducer can be attached to a glass interstitial component or to a display panel of a multi-layer display in order to control the moiré interference.

20 Claims, 6 Drawing Sheets

(56) References Cited

U.S. PATENT DOCUMENTS

| | | |
|---|---|---|
| 2010/0105454 A1 | 4/2010 | Weber et al. |
| 2010/0234089 A1 | 9/2010 | Saffari et al. |
| 2010/0234091 A1 | 9/2010 | Baerlocher et al. |
| 2010/0248577 A1 | 9/2010 | Bell et al. |
| 2011/0006971 A1* | 1/2011 | Ebey et al. .................... 345/1.3 |
| 2011/0111852 A1 | 5/2011 | Cohen et al. |
| 2011/0201404 A1 | 8/2011 | Wells |
| 2011/0285660 A1* | 11/2011 | Prabhu et al. ................. 345/174 |

* cited by examiner

US 9,030,726 B2

ACOUSTO-OPTIC MODULATOR FOR MULTI-LAYER DISPLAY

BACKGROUND

1. Field of the Described Embodiments

The described embodiments relate generally to gaming systems, such as gaming systems deployed in a casino enterprise. More particularly, apparatuses and methods for illuminating a display on an electronic gaming machine (EGM) are described.

2. Description of the Related Art

Multi-layer liquid crystal displays are typically used in EGMs to provide a display with a three-dimensional (3D) effect without the need for special 3D glasses. Such a multi-layer display typically layers two liquid crystal displays (LCDs) on top of one another to provide actual depth rather than just the illusion of depth. The two LCDs of a multi-layer display share a common backlight and each LCD receives coordinated independent control signals, thereby presenting a multi-layer visual display to the viewer. Imaging software can be used to complement the real depth to make the image content look truly 3D even though there are only two imaging planes.

An interstitial layer is positioned between the two LCDs to mitigate moiré interference. In displays, moiré patterns typically appear as ripples or waves superimposed on the screen image. Moiré interference can occur when two patterns are overlaid.

The interstitial layer is typically a micro-etched film. The etching on the film shapes the light transmitted through the micro-etched film. The etching on the interstitial layer can soften the pixel structure in the rear LCD panel by blurring it.

A 3D-like display in combination with mechanical reels allows players who prefer the feel of the more traditional mechanical reels to enjoy their favorite games with more interest and excitement. For example, a dynamic 3D image can be provided in front of the reels when there has been a winning spin. The popularity of 3D displays on EGMs allows for the possibility of displaying dynamic, vivid and engaging video content to further enhance the gaming experience in a casino gaming environment. In view of the above, methods and apparatuses are desired that allow for enhanced video display capable of providing a clear and adjustable 3D-like image on an EGM in a casino environment.

SUMMARY OF THE DESCRIBED EMBODIMENTS

A gaming system including EGMs having multi-layer displays is described. The multi-layer display can provide a 3D-like experience for the user. In particular, moiré interference in the multi-layer displays can be controlled by providing an acousto-optical modulator having a piezoelectric transducer. In some embodiments, the piezoelectric transducer is coupled to an interstitial component between display panels, and allows the interstitial component to act as an acousto-optical modulator. In other embodiments, the piezoelectric transducer is coupled to a display panel.

One aspect of the methods and apparatus described herein is related to an electronic gaming machine. A multi-layer display assembly for providing a 3D-like image on an electronic gaming machine for a wager-based game can include: a first display panel; a second display panel substantially parallel to and behind the first display panel; and an acousto-optical modulator that includes a piezoelectric transducer.

Another aspect of the methods and apparatus described herein is related to a method of making a multi-layer display assembly in an electronic gaming machine for a wager-based game. The method can be generally characterized as including: 1) providing a first display panel and a second display panel; and 2) forming an acousto-optical modulator for mitigating moiré interference in the display assembly. The acousto-optical modulator includes a piezoelectric transducer.

Yet another aspect of the methods and apparatus described herein is related to a method of adjusting a multi-layer display assembly in an electronic gaming machine for a wager-based game. The method can be generally characterized as: 1) providing the electronic gaming machine with the multi-layer display assembly; 2) turning on the multi-layer display; 3) determining whether a moiré pattern can be detected after the display assembly is turned on; and 4) adjusting an acousto-optical modulator if a moiré pattern is detected. The multi-layer display assembly includes an acousto-optical modulator.

BRIEF DESCRIPTION OF THE DRAWINGS

The embodiments will be readily understood by the following detailed description in conjunction with the accompanying drawings, wherein like reference numerals designate like structural elements, and in which.

DESCRIBED EMBODIMENTS

In this paper, numerous specific details are set forth to provide a thorough understanding of the concepts underlying the described embodiments. It will be apparent, however, to one skilled in the art that the described embodiments may be practiced without some or all of these specific details. In other instances, well known process steps have not been described in detail in order to avoid unnecessarily obscuring the underlying concepts.

A wager-based gaming system that can include an electronic gaming machine (EGM) with a multi-layer display is described. The multi-layer display can be a 3D-like display by providing real depth with multiple display panels positioned substantially parallel to and spaced apart from one another. In particular embodiments, EGMs used in a gaming environment can include multi-layer displays that can provide a 3D-like image. The multi-layer display can include an acousto-optical modulator to mitigate the moiré effect. In one embodiment, the acousto-optical modulator includes an interstitial component attached to a piezoelectric transducer. In other embodiments, the acousto-optical modulator includes a piezoelectric transducer coupled to one of the display panels. In some embodiments, the multi-layer displays can also reveal reels, whether mechanical or simulated, located behind the displays.

Figure 1:
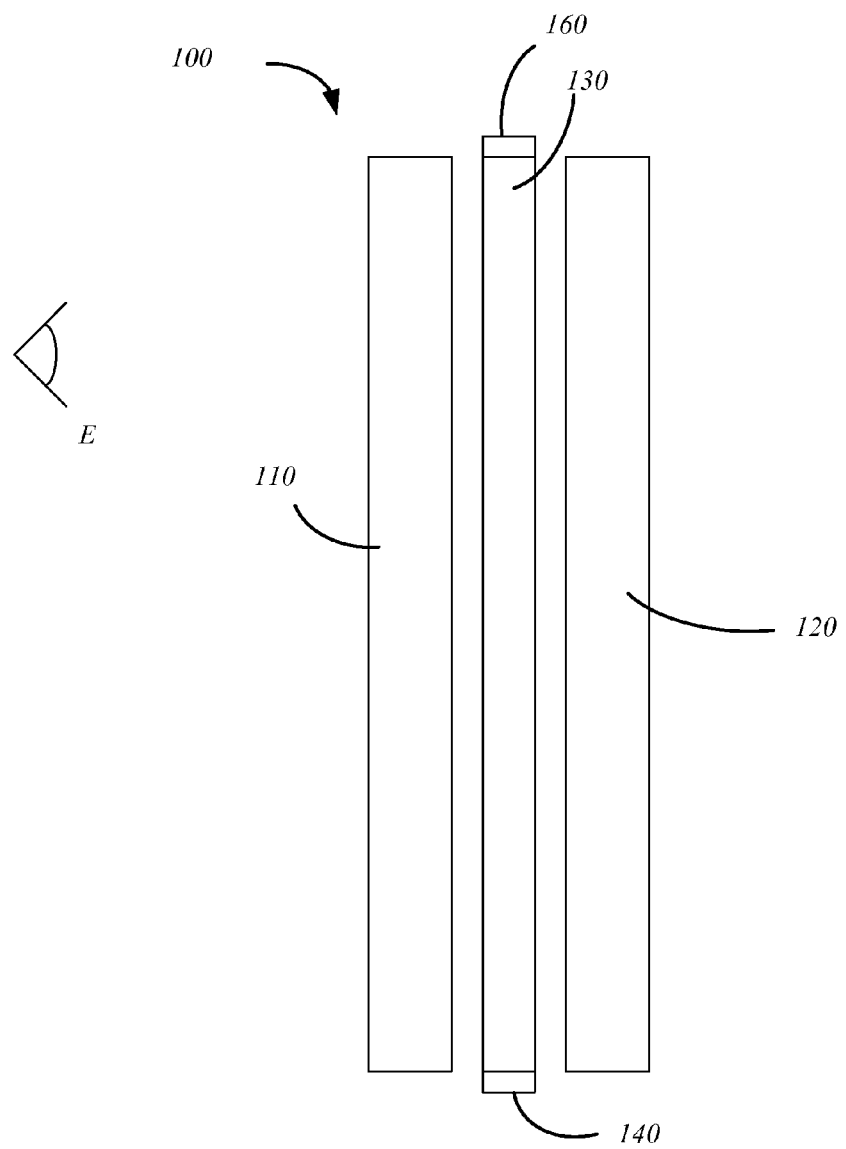
FIG. 1 is a side view of a multi-layer display in accordance with an embodiment.
Figure 2:
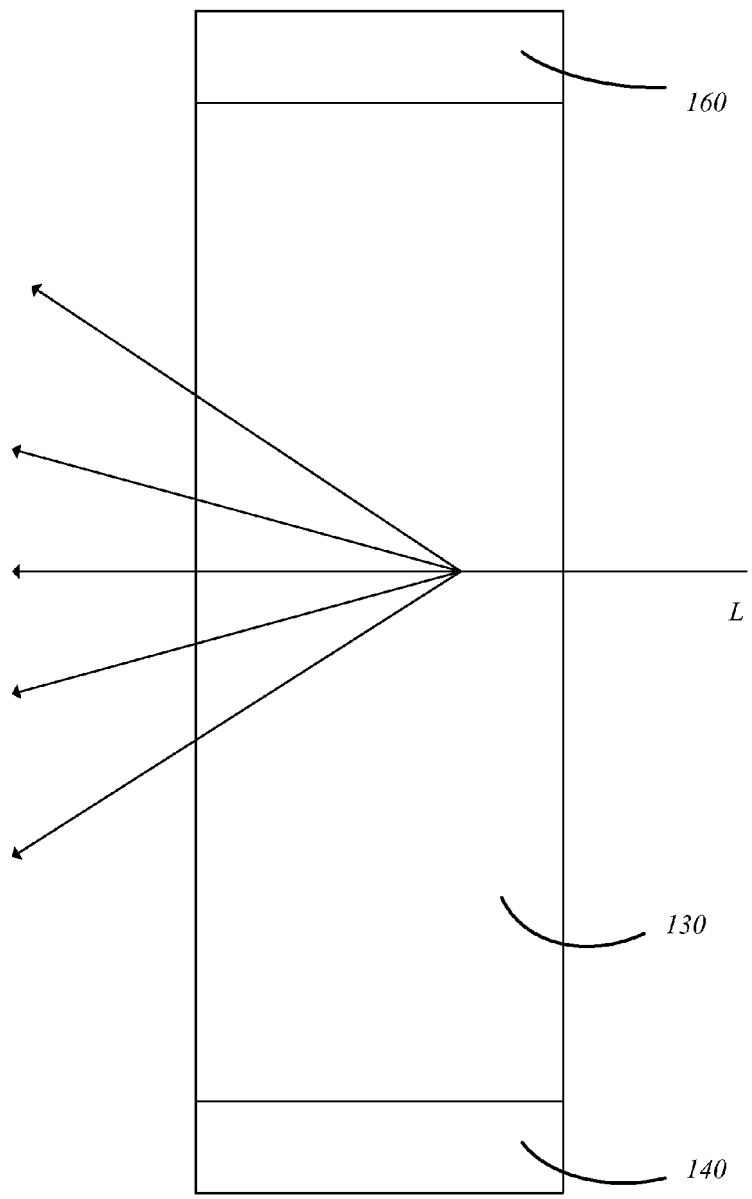
FIG. 2 shows a side view of an interstitial component with a piezoelectric transducer in accordance with an embodiment.

An example of a multi-layer display having an acousto-optic modulator interstitial component with a piezoelectric transducer is described with respect to FIGS. 1 and 2. With respect to FIG. 3, a method for making an embodiment of a multi-layer display for an EGM is described. With respect to FIG. 4, a method of adjusting an embodiment of a multi-layer display for an EGM is described. Finally, additional details of a game controller and an EGM are described with respect to FIGS. 5 and 6.

FIG. 1 is a side view of an embodiment of a multi-layer display 100 with one display panel, such as a LCD panel, positioned behind another. As shown in FIG. 1, two display panels that are substantially the same size are stacked such that a rear display panel 120 is positioned directly behind a front display panel 110. Thus, in FIG. 1, the eye E represents the position of the viewer relative to the multi-layer display 100. As LCDs are typically semi-transparent, the rear display panel 120 can be seen through the front display panel 110. As the front display panel 110 is at least semi-transparent and closer to the viewer, the images on the front display panel 110 appear at a different physical level of 3D depth as compared to images that appear on the rear display panel 120.

Typically, a key component in a multi-layer display is an interstitial layer positioned between two display panels. The interstitial component is provided to mitigate moiré interference, which can occur in multi-layer displays. According to the embodiment shown in FIG. 1, an acousto-optic modulator interstitial component is provided. An acousto-optic modulator, which is sometimes known as a Bragg cell, can diffract light and shift the frequency using sound waves. In this embodiment, an interstitial component 130 having a piezoelectric transducer can be used in place of a traditional etched interstitial layer to mitigate the moiré interference. In an embodiment, the piezoelectric transducer can be attached to a glass interstitial component positioned between two display panels. As described in more detail below, in another embodiment, the acousto-optical modulator is formed by coupling a piezoelectric transducer with one of the display panels without an interstitial component.

According to an embodiment, the acousto-optic modulator interstitial component includes a component 130 that is at least semi-transparent and a piezoelectric transducer 140 attached to the semi-transparent component 130. The interstitial component 130 can be fully transparent. In one embodiment, the interstitial component is glass. In this embodiment, an acoustic absorber 160 can also be attached to the semi-transparent component 130. As shown in FIG. 1, the acoustic absorber 160 can be attached to the semi-transparent component 130 opposite the piezoelectric transducer 140.

The interstitial component 130 can also have substantially the same length and width as the display panels 110, 120. It will be understood that the interstitial component 130 should be large enough to mitigate the moiré interference created by the stacked display panels. The interstitial component 130 can also be positioned such that it is between the display panels 110, 120 and also substantially parallel to each of the display panels 110, 120. While only two display panels are described in the illustrated embodiment, it will be understood that a multi-layer display assembly can include more than two display panels. An interstitial component for mitigating moiré interference can be provided between multiple display panels.

As shown in FIG. 2, the piezoelectric transducer 140 can be attached to the interstitial component 130. According to an embodiment, the interstitial component 130 can be formed of glass or quartz. The piezoelectric transducer 140 can convert electrical energy into acoustic energy. An oscillating electric signal can drive the piezoelectric transducer 140 to vibrate, which can create sound waves in the glass component. The sound waves are similar to moving planes of expansion and compression that change the index of refraction and attenuate the moiré interference.

The backlight provides incoming light L from the rear display panel 120 through the interstitial component 130 and then through the front display panel 110. This incoming light L through the rear display panel 120 can scatter as it passes through the interstitial component 130. As shown in FIG. 2, a light beam L passing through the interstitial component 130 can be diffracted into several orders.

Unlike traditional micro-etched interstitial components that have to be replaced if the distance between display panels changes (or if a different panel is used), the interstitial component 130 with piezoelectric transducer 140 can be tuned or adjusted without needing to be replaced. For example, if a distance between display panels is adjusted, the interstitial component 130 can simply be tuned or adjusted without moving or replacing it with a new one. The properties of the light L exiting the interstitial component 130 can be controlled by adjusting the vibration of the piezoelectric transducer 140. In an embodiment, the frequency of the sound wave can be in the range of about 100 MHz.

The interstitial component 130 can also be fully transparent because the piezoelectric transducer 140 attached to it eliminates the need for micro-etching the interstitial component 130. Although a glass interstitial component has been described, it will be understood that the interstitial component can be formed of other suitable materials, such as, for example, crystal quartz or calcite, tellurium dioxide or fused silica.

According to another embodiment, the acousto-optical modulator includes a piezoelectric transducer 140 coupled to one of the display panels 110, 120. In this embodiment, the multi-layer display 100 does not have an interstitial component. The piezoelectric transducer can be coupled to either the front display panel or the rear display panel. In this embodiment, the vibrations from the piezoelectric transducer create sound waves, which change the index of refraction, in the display panel to mitigate the moiré interference.

In some embodiments, the sound waves created by the piezoelectric transducer can have a fixed frequency. In other embodiments, the sound waves created by the piezoelectric transducer can have variable frequencies. It will be understood that although a single piezoelectric transducer is described in the embodiments above, it will be understood that two piezoelectric transducers can be provided. For example, the piezoelectric transducers can be provided on opposite ends of the same display panel or on opposite ends of the same interstitial component.

Figure 3:
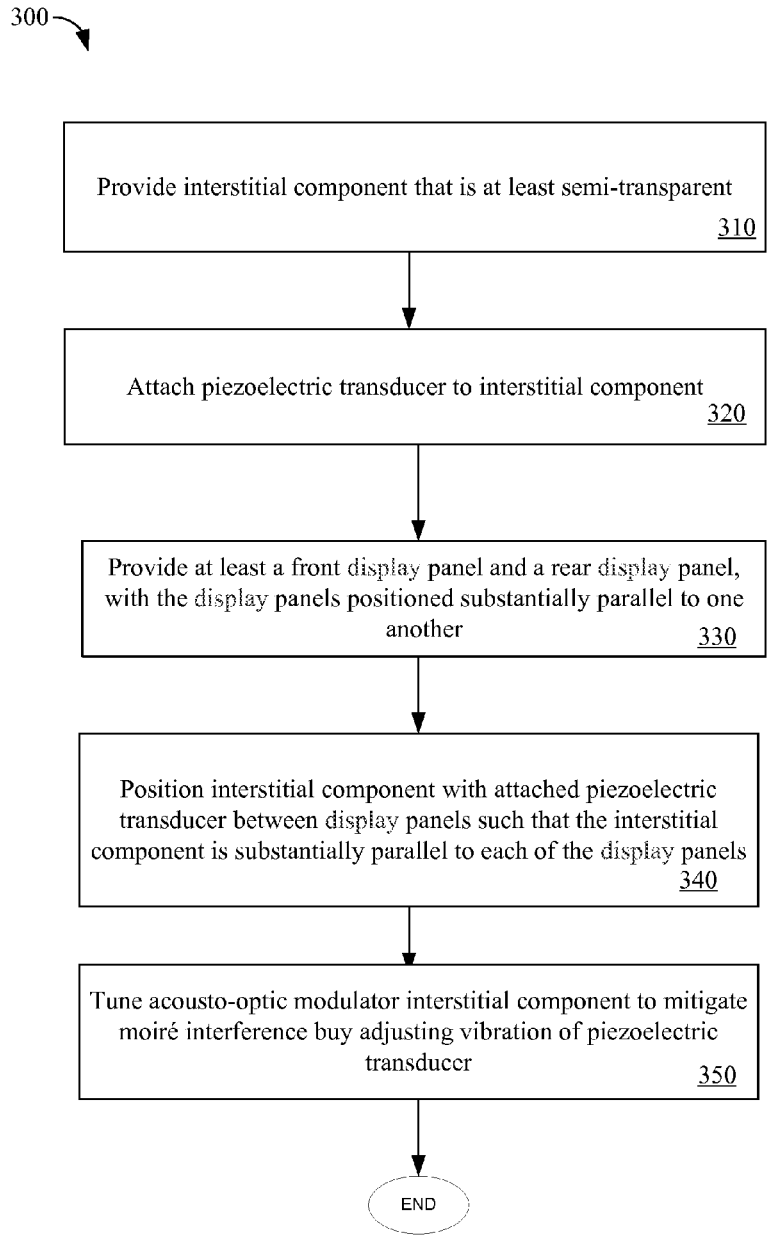
FIG. 3 is a flow diagram of a method for making a multi-layer display device for an EGM according to an embodiment.

FIG. 3 is a flow chart of a method 300 for making a multi-layer display device for an EGM according to an embodiment. Steps 310-320 describe making an acousto-optic modulator interstitial component for a multi-layer display assembly in this embodiment. In 310, an interstitial component is provided. The interstitial component is at least semi-transparent and can be fully transparent. A piezoelectric transducer is then attached to the interstitial component to form the acousto-optical modulator interstitial component in 320. In 330, at least a front display panel and a rear display panel are provided, with the display panels positioned substantially parallel to one another. In 340, the interstitial component with the attached piezoelectric transducer is positioned between the display panels such that the interstitial component is substantially parallel to each of the display panels. In 350, the acousto-optic modulator interstitial component can then be tuned to mitigate moiré interference by adjusting the vibration of the piezoelectric transducer.

According to another embodiment, the method starts providing at least a front display panel and a rear display panel, with the display panels positioned substantially parallel to one another. The acousto-optical modulator is then formed by coupling a piezoelectric transducer with one of the display panels. The acousto-optic modulator can then be tuned to mitigate moiré interference by adjusting the vibration of the piezoelectric transducer.

Figure 4:
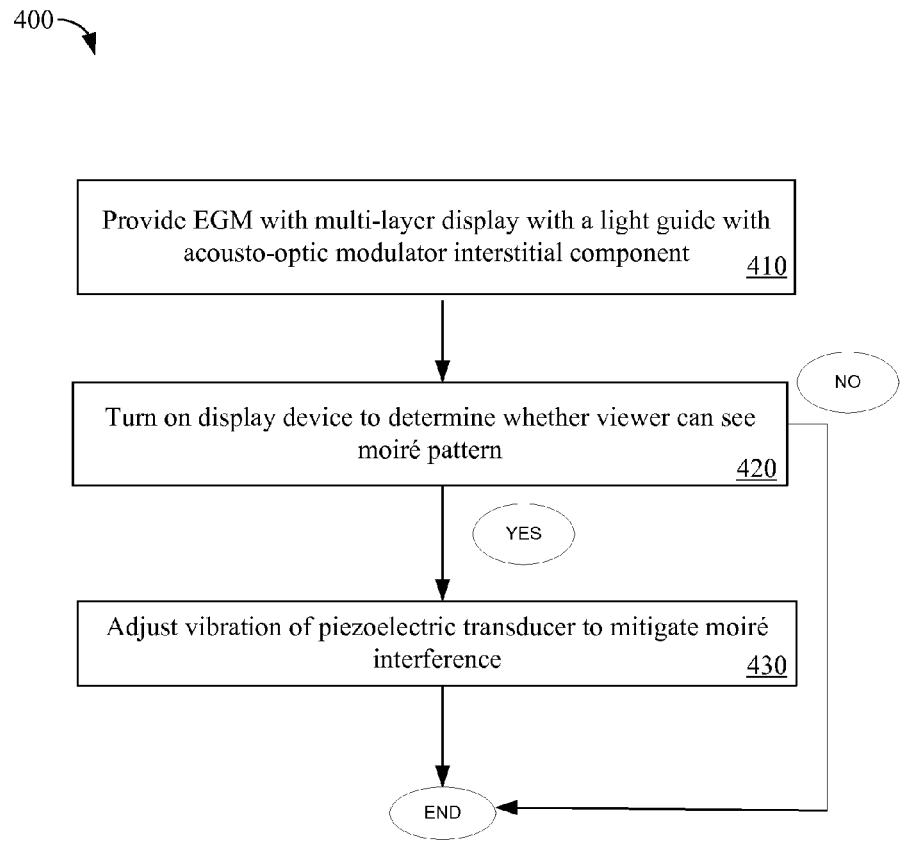
FIG. 4 is a flow diagram of a method of adjusting a multi-layer display device of an EGM according to an embodiment.

FIG. 4 is a flow chart of a method 400 of adjusting a multi-layer display device of an EGM according to an embodiment. In 410, an EGM having a multi-layer display device with an acousto-optic modulator interstitial component is provided. The acousto-optic modulator interstitial component includes a component, which is formed of a material that is at least semi-transparent, attached to a piezoelectric transducer. The interstitial component is positioned between two substantially parallel display panels such that the interstitial component is substantially parallel to each of the display panels. The component that is at least semi-transparent can be sized appropriately to mitigate moiré interference. In on embodiment, the component that is at least semi-transparent has substantially the same length and width as the display panels.

In 420, the display device is turned on to determine whether moiré interference can be detected by the viewer. If the user can see a moiré pattern, the acousto-optic modulator interstitial component is adjusted in 430 by adjusting the vibration of the piezoelectric transducer in order to mitigate the moiré interference. If the viewer cannot see a moiré pattern, the acousto-optic modulator interstitial component does not need to be adjusted.

Figure 5:
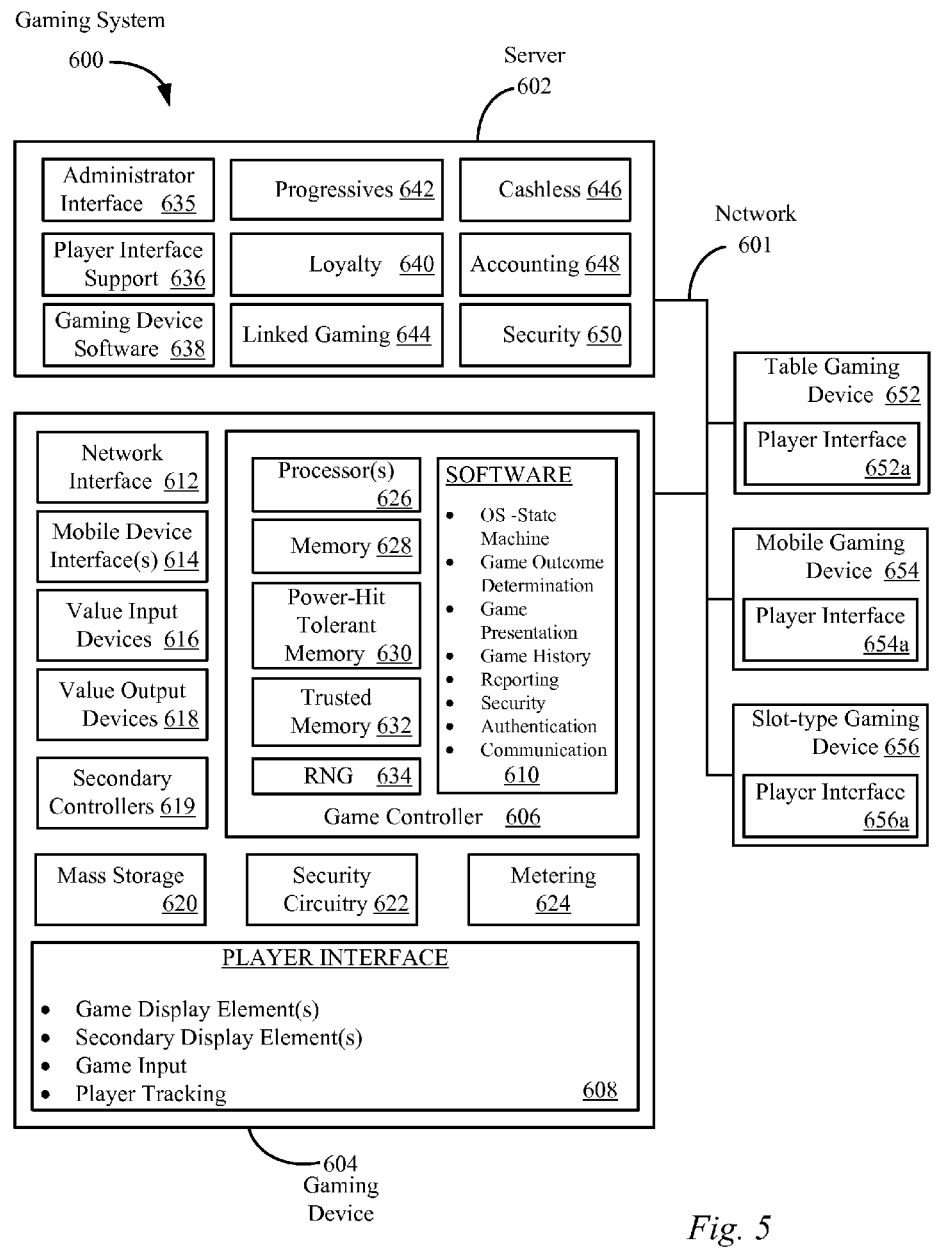
FIG. 5 shows a block diagram of a gaming system including a server and gaming devices in accordance with the described embodiments.

FIG. 5 shows a block diagram of a gaming system 600 in accordance with the described embodiments. The gaming system 600 can include one or more servers, such as server 602, and a variety of gaming devices including but not limited to table gaming devices, such as 652, mobile gaming devices, such as 654, and slot-type gaming devices, such as 656. The table gaming devices, such as 652, can include apparatus associated with table games where a live operator or a virtual operator is employed. The gaming devices and one or more servers can communicate with one another via a network 601. The network can include wired, wireless or a combination of wired and wireless communication connections and associated communication routers.

Some gaming devices, such as 652, 654 and 656, can be configured with a player interface that allows at least 1) selections, such as a wager amount, associated with a wager-based game to be made and 2) an outcome of the wager-based game to be displayed. As an example, gaming devices, 652, 654 and 656, include player interfaces, 652a, 654a and 656a, respectively. Typically, gaming devices with a player interface are located in publicly accessible areas, such as a casino floor. On the other hand, some gaming devices, such as server 602, can be located in publically inaccessible areas, such is in a back-room of a casino or even off-site from the casino. Gaming devices located in publicly inaccessible areas may not include a player interface. For instance, server 602 does not include a player interface. However, server 602 includes an administrator interface 635 that allows functions associated with the server 602 to be adjusted.

An example configuration of a gaming device is described with respect to gaming device 604. The gaming device 604 can include 1) a game controller 606 for controlling a wager-based game played on the gaming device and 2) a player interface 608 for receiving inputs associated with the wager-based game and for displaying an outcome to the wager-based game. In more detail, the game controller 606 can include a) one or more processors, such as 626, b) memory for holding software executed by the one or more processors, such as 628, c) a power-hit tolerant memory, such as 630, d) one or more trusted memories, such as 632, e) a random number generator and f) a plurality of software applications, 610. The other gaming devices, including table gaming device 652, mobile gaming device 654, slot-type gaming device 656 and server 602, can each include a game controller with all or a portion of the components described with respect to game controller 606. Typically, the power-hit tolerant memory is a non-volatile memory of some type.

In particular embodiments, the gaming device can utilize a "state" machine architecture. In a "state" machine architecture critical information in each state is identified and queued for storage to a persistent memory. The architecture doesn't advance to the next state from a current state until all the critical information that is queued for storage for the current state is stored to the persistent memory. Thus, if an error condition occurs between two states, such as a power failure, the gaming device implementing the state machine can likely be restored to its last state prior to the occurrence of the error condition using the critical information associated with its last state stored in the persistent memory. This feature is often called a "roll back" of the gaming device. Examples of critical information can include but are not limited to an outcome determined for a wager-based game, a wager amount made on the wager-based game, an award amount associated with the outcome, credits available on the gaming device and a deposit of credits to the gaming device.

The power-hit tolerant memory 630 can be used as a persistent memory for critical data, such as critical data associated with maintaining a "state" machine on the gaming device. One characteristic of a power-hit tolerant memory 630 is a fast data transfer time. Thus, in the event of a power-failure, which might be indicated by a sudden power fluctuation, the critical data can be quickly loaded from volatile memory, such as RAM associated with the processor 626, into the power-hit tolerant memory 630 and saved.

In one embodiment, the gaming device 605 can be configured to detect power fluctuations and in response, trigger a transfer of critical data from RAM to the power-hit tolerant memory 630. One example of a power-hit tolerant memory 630 is a battery-backed RAM. The battery supplies power to the normally volatile RAM so that in the event of a power failure data is not lost. Thus, a battery-backed RAM is also often referred to as a non-volatile RAM or NV-RAM. An advantage of a battery-backed RAM is that the fast data transfer times associated with a volatile RAM can be obtained.

The trusted memory 632 is typically a read-only memory of some type that may be designed to be unalterable. An EPROM or EEPROM are two types of memory that can be used as a trusted memory 632. The gaming device 604 can include one or more trusted memories. Other types of memories, such as Flash memory, can also be utilized as an unalterable memory and the example of an EPROM or EEPROM is provided for purposes of illustration only.

Prior to installation the contents of a trusted memory, such as 632, can be verified. For instance, a unique identifier, such as a hash value, can be generated on the contents of the memory and then compared to an accepted hash value for the contents of the memory. The memory may not be installed if the generated and accepted hash values do not match. After installation, the gaming device can be configured to check the contents of the trusted memory. For instance, a unique identifier, such as a hash value, can be generated on contents of the trusted memory and compared to an expected value for the unique identifier. If the generated value of the unique identifier and the expected value of the unique identifier don't match, then an error condition can be generated on the gaming device 604. In one embodiment, the error condition can result in the gaming device entering a tilt state where game play is temporarily disabled on the gaming device.

Sometimes verification of software executed on the gaming device 604 can be performed by a regulatory body, such as a government agency. Often software used by a game controller, such as 606, can be highly regulated, where only software approved by a regulatory body is allowed to be executed by the game controller 606. In one embodiment, the trusted memory 632 can store authentication programs and/or authentication data for authenticating the contents of various memories on the gaming device 604. For instance, the trusted memory 632 can store an authentication program that can be used to verify the contents of a mass storage device, such as 620, which can include software executed by the game controller 606.

The random number generator (RNG) 634 can be used to generate random numbers that can be used to determine outcomes for a game of chance played on the gaming device. For instance, for a mechanical or video slot reel type of game, the RNG, in conjunction with a paytable that lists the possible outcomes for a game of chance and the associated awards for each outcome, can be used to generate random numbers for determining reel positions that display the randomly determined outcomes to the wager-based game. In other example, the RNG might be used to randomly select cards for a card game. Typically, as described above, the outcomes generated on a gaming device, such as 604, are considered critical data. Thus, generated outcomes can be stored to the power-hit tolerant memory 630.

Not all gaming devices may be configured to generate their own game outcomes and thus, may not use an RNG for this purpose. In some embodiments, game outcomes can be generated on a remote device, such as server 602, and then transmitted to the gaming device 604 where the outcome and an associated award can be displayed to the player via the player interface 608. For instance, outcomes to a slot-type game or a card game can be generated on server 602 and transmitted to the gaming device 604.

In other embodiments, the gaming device 604 can be used to play central determination games, such as bingo and lottery games. In a central determination game, a pool of game outcomes can be generated and then, particular game outcomes can be selected as needed (e.g., in response to a player requesting to play the central determination game) from the pool of previously generated outcomes. For instance, a pool of game outcomes for a central determination game can be generated and stored on server 602. Next, in response to a request to play the central determination game on gaming device 604, one of the outcomes from the pool can be downloaded to the gaming device 604. A game presentation including the downloaded outcome can be displayed on the gaming device 604.

In other embodiments, thin client type gaming devices, such as mobile gaming devices used to play wager-based video card or video slot games, may be configured to receive at least game outcomes from a remote device and not use an RNG to generate game outcomes locally. The game outcomes can be generated remotely in response to inputs made on the mobile device, such as an input indicating a wager amount and/or an input to initiate the game. This information can be sent from the mobile device to a remote device, such as from mobile gaming device 654 to server 602. After receiving the game outcome from the remote device, a game presentation for the game outcomes generated remotely can be generated and displayed on the mobile device. In some instances, the game presentation can also be generated remotely and then streamed for display to the mobile device.

The game controller 606 can be configured to utilize and execute many different types of software applications 610. Typically, the software applications utilized by the game controller 606 can be highly regulated and may undergo a lengthy approval process before a regulatory body allows the software applications to be utilized on a gaming device deployed in the field, such as in a casino. One type of software application the game controller can utilize is an Operating System (OS). The OS can allow various programs to be loaded for execution by the processor 626, such as programs for implementing a state machine on the gaming device 606. Further, the OS can be used to monitor resource utilization on the gaming device 606. For instance, certain applications, such as applications associated with game outcome generation and game presentation that are executed by the OS can be given higher priority to resources, such as the processor 626 and memory 628, than other applications that can be executing simultaneously on the gaming device.

As previously described, the gaming device 604 can execute software for determining the outcome of a wager-based game and generating a presentation of the determined game outcome including displaying an award for the game. As part of the game outcome presentation one or more of 1) electro-mechanical devices, such as reels or wheels, can be actuated, 2) video content can be output to video displays, 3) sounds can be output to audio devices, 4) haptic responses can be actuated on haptic devices or 5) combinations thereof, can be generated under control of the game controller 606. The peripheral devices used to generate components of the game outcome presentation can be associated with the player interface 608 where the types of devices that are utilized for the player interface 608 can vary from device to device.

To play a game, various inputs can be required. For instance, via input devices coupled to the gaming device 604, a wager amount can be specified, a game can be initiated or a selection of a game choice associated with the play of the game can be made. The software 610 executed by the game controller 606 can be configured to interpret various signals from the input devices, such as signals received from a touch screen controller or input buttons, and affect the game played on the gaming device in accordance with the received input signals. The input devices can also be part of the player interface 608 provided with the gaming device, such as 604.

In other embodiments, the gaming software 610 executed by the game controller 606 can include applications that allow a game history including the results of a number of past games to be stored, such as the previous 10 or 100 games played on the gaming device 604. The game history can be stored to a persistent memory including but not limited to the power-hit tolerant memory 630. The gaming controller 606 can configured to provide a menu (typically, only operator accessible), that allows the results of a past game to be displayed via the player interface 608. The output from the history menu can include a re-creation of the game presentation associated with a past game outcome, such as a video representation of card hand associated with a video poker game, a video representation of a reel configuration associated with a video slot game, and/or raw data associated with the past game result, such as an award amount, an amount wagered, etc. The history menu can be used for dispute resolution purposes, such as if a player complains that they have not been properly awarded for a game previously played on the gaming device 604.

The reporting software can be used by the game controller 606 to report events that have occurred on the gaming device 604 to remote device, such as server 602. For instance, in one embodiment, the game controller 606 can be configured to report error conditions that have been detected on the gaming device 604, such as if a device has malfunctioned or needs attention. For instance, the reporting software can be used to send a message from the gaming device 604 to the server 602 indicating that a printer on the gaming device needs a refill of tickets. In another embodiment, the gaming controller 606 can be configured to report security events that may have occurred on the gaming device 604, such as but not limited to if a door is opened, a latch is activated or an interior portion of the gaming device 604 has been accessed.

In yet other embodiments, the game controller 606 can be configured to report gaming activity and associated events that has been generated on the gaming device, such as a deposit of cash or an indicia of credit, at the gaming device, a generation of game outcome including an associated award amount and a dispensation of cash or an indicia of credit from the gaming device 604. As part of a loyalty program, the gaming activity can be associated with a particular player. The reporting software can include player tracking elements that allow the gaming activity of a particular player to be reported to a remote device, such as server 602.

The game controller 606 can execute the authentication software to verify the authenticity of data and/or software programs executed on the gaming device 604. For instance, the authentication software can be used to verify the authenticity of data and/or software applications when they are first downloaded to the gaming device 604. Further, the authentication software can be used to periodically verify the authenticity of data and/or software applications currently residing on the gaming device, such as software applications stored on one of the memories coupled to the gaming device 604 including applications loaded into the memory 628 for execution by the processor 626.

The communication software executed by the game controller 606 can be used to communicate with a variety of devices remote to the gaming device 604. For instance, the communication software can be used to communicate with one or more of a) servers remote to the device, such as 602, b) other gaming devices, such as table gaming device 652, mobile gaming device 654 and slot-type gaming device 656 and c) mobile devices carried by casino personnel or players in the vicinity of the gaming device 604. Via the communication software, the game controller can be configured to communicate via many different communication protocols. For instance, different wireless and/or wired communication protocols can be implemented. Further, proprietary or non-proprietary gaming specific protocols can be implemented. For instance, gaming specific non-proprietary communication protocols, such as G2S (game to system), GDS (gaming device standard) and S2S (system to system) communication protocols provided by the Gaming Standards Association (GSA), Fremont, Calif., can be implemented on the gaming devices described herein.

The gaming device 604 can communicate with one or more remote devices via one or more network interfaces, such as 612. For instance, via network interfaces 612 and the network 601, the gaming device 604 can communicate with other gaming devices, such as server 602 and/or gaming devices, 652, 654 and 656. The network interfaces can provide wired or wireless communications pathways for the gaming device 604. Some gaming devices may not include a network interface or can be configured to operate in a stand-alone mode where the network interface is not connected to a network.

The gaming device 604 can include one or more each of value input devices 616 and value output device 618. The value input devices 616 can be used to deposit cash or indicia of credit onto the gaming device. The cash or indicia of credit can be used to make wagers on games played on the gaming device 604. Examples of value input devices 616 include but are not limited to a magnetic-striped card or smart card reader, a bill and/or ticket acceptor, a network interface for downloading credits from a remote source, a wireless communication interface for reading credit data from nearby devices and a coin acceptor. A few examples of value input devices are shown in FIG. 5.

The value output devices can be used to dispense cash or indicia of credit from the gaming device 604. Typically, the indicia of credit can be exchanged for cash. For instance, the indicia of credit can be exchanged at a cashier station or at a redemption station. Examples of value output devices can include a network interface for transferring credits into a remote account, a wireless communication interface that can be used with a mobile device implementing mobile wallet application, a coin hopper for dispensing coins or tokens, a bill dispenser, a card writer, a printer for printing tickets or cards redeemable for cash or credits. Another type of value output device is a merchandise dispenser, which can be configured to dispense merchandise with a tangible value from a gaming device. A few examples of value output devices are shown in FIG. 5.

The combination of value input devices 616 and value output devices 618 can vary from device to device. In some embodiments, a gaming device 604 may not include a value input device or a value output device. For instance, a thin-client gaming device used in a mobile gaming application may not include a value input device and a value output device. Instead, a remote account can be used to maintain the credits won or lost from playing wager-based games via the mobile device. The mobile device can be used to access the account and affect the account balance via game play initiated on the mobile device. Credits can be deposited or withdrawn from the remote account via some mechanism other than via the mobile device interface.

In yet other embodiments, the gaming device 604 can include one or more secondary controllers 619. The secondary controllers can be associated with various peripheral devices coupled to the gaming device, such as the value input devices and value output devices described in the preceding paragraphs. As another example, the secondary controllers can be associated with peripheral devices associated with the player interface 608, such as input devices, video displays, electro-mechanical displays and a player tracking unit. In some embodiments, the secondary controllers can receives instructions and/or data from and provide responses to the game controller 606. The secondary controller can be configured to interpret the instructions and/or data from the game controller 606 and control a particular device according to the received instructions and/or data. For instance, a print controller may receive a print command with a number of parameters, such as a credit amount and in response print a ticket redeemable for the credit amount. In another example, a touch screen controller can detect touch inputs and send information to the game controller 606 characterizing the touch input.

In a particular embodiment, a secondary controller can be used to control a number of peripheral devices independently of the game controller 606. For instance, a player tracking unit can include one or more of a video display, a touch screen, card reader, network interface or input buttons. A player tracking controller can control these devices to provide player tracking services and bonusing on the gaming device 604. In alternate embodiments, the game controller 604 can control these devices to perform player tracking functions. An advantage of performing player tracking functions via a secondary controller, such as a player tracking controller, is that since the player tracking functions don't involve controlling the wager-based game, the software on the player tracking unit can be developed modified via a less lengthy and regulatory intensive process than is required for software executed by the game controller 606, which does control the wager-based game. In general, using a secondary controller, certain functions of the gaming device 604 that are not subject to as much regulatory scrutiny as the game play functions can be decoupled from the game controller 606 and implemented on the secondary controller instead. An advantage of this approach, like for the player tracking controller, is that software approval process for the software executed by the secondary controller can be less intensive than the process needed to get software approved for the game controller.

A mass storage unit(s) 620, such as a device including a hard drive, optical disk drive, flash memory or some other memory storage technology can be used to store applications and data used and/or generated by the gaming device 604. For instance, a mass storage unit, such as 620, can be used to store gaming applications executed by the game controller 606 where the gaming device 604 can be configured to receive downloads of game applications from remote devices, such as server 602. In one embodiment, the game controller 606 can include its own dedicated mass storage unit. In another embodiment, critical data, such as game history data stored in the power-hit tolerant memory 630 can be moved from the power-hit tolerant memory 630 to the mass storage unit 620 at periodic intervals for archival purposes and to free up space in the power-hit tolerant memory 630.

The gaming device 604 can include security circuitry 622, such as security sensors and circuitry for monitoring the sensors. The security circuitry 622 can be configured to operate while the gaming device is receiving direct power and operational to provide game play as well as when the gaming device is uncoupled from direct power, such as during shipping or in the event of a power failure. The gaming device 604 can be equipped with one or more secure enclosures, which can include locks for limiting access to the enclosures. One or more sensors can be located within the secure enclosures or coupled to the locks. The sensors can be configured to generate signals that can be used to determine whether secure enclosures have been accessed, locks have been actuated or the gaming device 604, such as a mobile device has been moved to an unauthorized area. The security monitoring circuitry can be configured to generate, store and/or transmit error events when the security events, such as accessing the interior of the gaming device, have occurred. The error events may cause the game controller 606 to place itself in a "safe" mode where no game play is allowed until the error event is cleared.

The server 602 can be configured to provide one or more functions to gaming devices or other servers in a gaming system 600. The server 602 is shown performing a number of different functions. However, in various embodiments, the functions can be divided among multiple servers where each server can communicate with a different combination of gaming devices. For instance, player interface support 636 and gaming device software 638 can be provided on a first server, progressives can be provided on a second server, loyalty program functions 640 and accounting 648 can be provided on a third server, linked gaming 644 can be provided on a fourth server, cashless functions 646 can be provided on a fifth server and security functions 650 can be provided on a sixth server. In this example, each server can communicate with a different combination of gaming devices because each of the functions provided by the servers may not be provided to every gaming device in the gaming system 600. For instance, the server 602 can be configured to provide progressive gaming functions to gaming devices 604, 652 and 656 but not gaming device 654. Thus, the server 602 may not communicate with the mobile gaming device 654 if progressive functions are not enabled on the mobile gaming device at a particular time.

Typically, each server can include an administrator interface that allows the functions of a server, such as 602, to be configured and maintained. Each server 602 can include a processor and memory. In some embodiments, the servers, such as 602, can include a game controller with components, such as but not limited to a power-hit tolerant memory 630, a trusted memory 632 and an RNG 634 described with respect to gaming device 604. The servers can include one or more network interfaces on which wired or wireless communication protocols can be implemented. Next, some possible functions provided by the server 602 are described. These functions are described for the purposes of illustration only and are not meant to be limiting.

The player interface support 636 can be used to serve content to gaming devices, such as 604, 652, 654 and 656, remote to the server. The content can include video and audio content that can be output on one of the player interfaces, such as 608, 652a, 654a and 656a. Further, the content can be configured to utilize unique features of a particular player interface, such as video displays, wheels or reels, if the particular player interface is so equipped.

In one embodiment, via the player interface support, content can be output to all or a portion of a primary video display that is used to output wager-based game outcomes on a player interface associated with a gaming device. For instance, a portion of the primary display can be allocated to providing a "service window" on the primary video display where the content in the service window is provided from a server remote to the gaming device. In particular embodiments, the content delivered from the server to a gaming device as part of the player interface support 636 can be affected by inputs made on the gaming device. For instance, the service window can be generated on a touch screen display where inputs received via the service window can be sent back to server 602. In response, to the received inputs, the server 602 can adjust the content that is displayed on the remote gaming device that generated the inputs.

If a player's identity is known, then the player interface support 636 can be used to provide custom content to a remote gaming device, such as 604. For instance, a player can provide identification information, such as information indicating their membership in a loyalty program, during their utilization of a gaming device. The custom content can be selected to meet the identified player's interests. In one embodiment, the player's identity and interests can be managed via a loyalty program, such as via a loyalty program account associated with loyalty function 640. The custom content can include notifications, advertising and specific offers that are determined to be likely of interest to a particular player.

The gaming device software function 638 can be used to provide downloads of software for the game controller and/or second controllers associated with peripheral devices on a gaming device. For instance, the gaming device software 638 may allow an operator and/or a player to select a new game for play on a gaming device. In response to the game selection, the gaming device software function 638 can be used to download game software that allows a game controller to generate the selected game. In another example, in response to determining that a new counterfeit bill is being accepted by bill acceptors in the gaming system 600, the gaming device software function 638 can be used to download a new detection algorithm to the bill acceptors that allow the counterfeit bill to be detected.

The progressive gaming function 642 can be used to implement progressive game play on one or more gaming devices. In progressive game play, a portion of wagers associated with the play of a progressive game is allocated to a progressive jackpot. A group of gaming devices can be configured to support play of the progressive game and contribute to the progressive jackpot. In various embodiments, the gaming devices contributing to a progressive jackpot may be a group of gaming devices collocated near one another, such as a bank of gaming machines on a casino floor, a group of gaming devices distributed throughout a single casino, or group of gaming devices distributed throughout multiple casinos (e.g., a wide area progressive). The progressive gaming function 642 can be used to receive the jackpot contributions from each of the gaming devices participating in the progressive game, determine a current jackpot and notify participating gaming devices of the current progressive jackpot amount, which can be displayed on the participating gaming devices if desired.

The loyalty function 640 can be used to implement a loyalty program within a casino enterprise. The loyalty function 640 can be used to receive information regarding activities within a casino enterprise including gaming and non-gaming activities and associate the activities with particular individuals. The particular individuals can be known or may be anonymous. The loyalty function 640 can used to store a record of the activities associated with the particular individuals as well as preferences of the individuals if known. Based upon the information stored with the loyalty function 640 comps (e.g., free or discounted services including game play), promotions and custom contents can be served to the particular individuals.

The linked gaming function 644 can be used to used provide game play activities involving player participating as a group via multiple gaming devices. An example, a group of player might be competing against one another as part of a slot tournament. In another example, a group of players might be working together in attempt to win a bonus that can be shared among the players.

The cashless function 646 can enable the redemption and the dispensation of cashless instruments on a gaming device. For instance, via the cashless function, printed tickets, serving as a cashless instrument, can be used to transfer credits from one gaming device to another gaming device. Further, the printed tickets can be redeemed for cash. The cashless function can be used to generate identifying information that can be stored to a cashless instrument, such as a printed ticket, that allows the instrument to later be authenticated. After authentication, the cashless instrument can be used for additional game play or redeemed for cash.

The accounting function can receive transactional information from various gaming devices within the gaming system 600. The transactional information can relate to value deposited on each gaming device and value dispensed from each gaming device. The transactional information, which can be received in real-time, can be used to assess the performance of each gaming device as well as an overall performance of the gaming system. Further, the transactional information can be used for tax and auditing purposes.

The security function 650 can be used to combat fraud and crime in a casino enterprise. The security function 650 can be configured to receive notification of a security event that has occurred on a gaming device, such as an attempt at illegal access. Further, the security function 650 can receive transactional data that can be used to identify if gaming devices are being utilized in a fraudulent or unauthorized manner. The security function 650 can be configured to receive, store and analyze data from multiple sources including detection apparatus located on a gaming device and detection apparatus, such as cameras, distributed throughout a casino. In response to detecting a security event, the security function 650 can be configured to notify casino personnel of the event. For instance, if a security event is detected at a gaming device, a security department can be notified. Depending on the security event, one or more team members of the security department can be dispatched to the vicinity of the gaming device. Next, a perspective diagram of a slot-type gaming device that can include all or a portion of the components described with respect to gaming device 604 is described.

Figure 6:
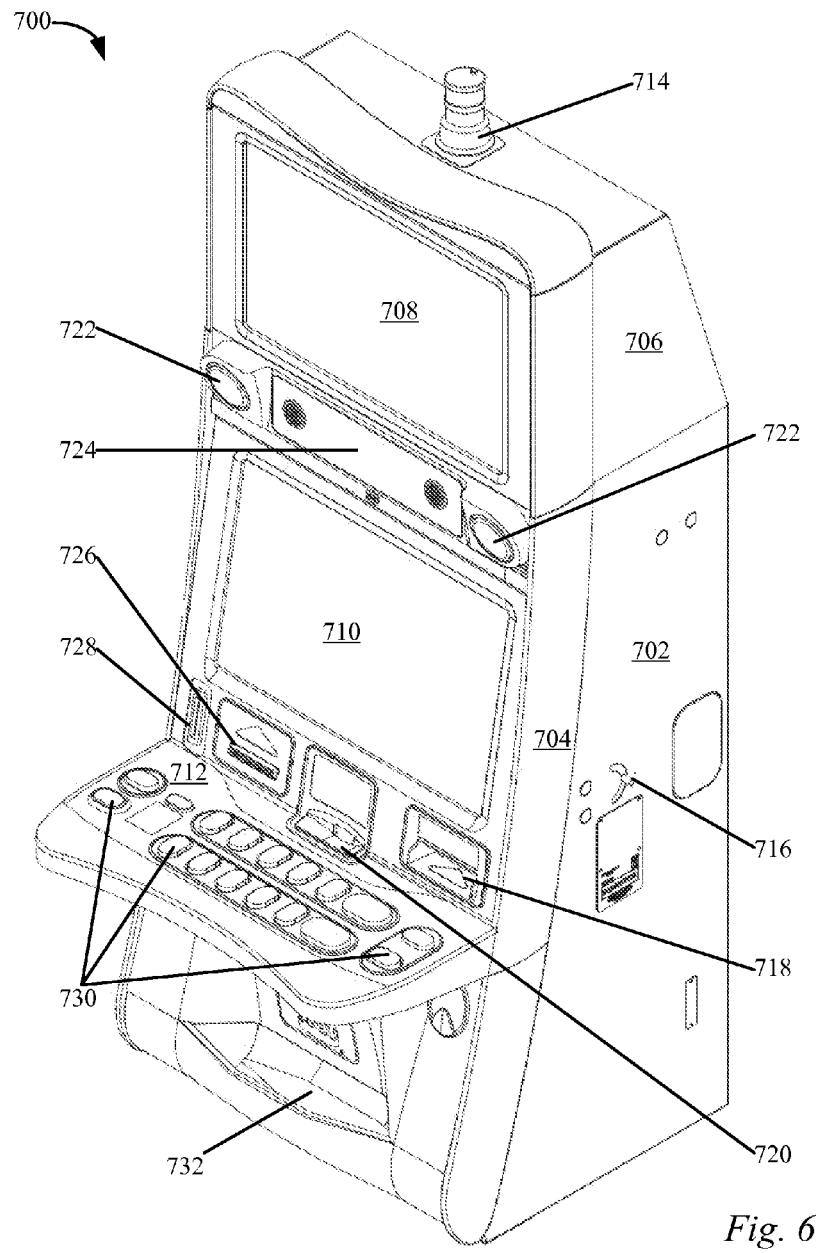
FIG. 6 shows a perspective drawing of a gaming device in accordance with the described embodiments.

FIG. 6 shows a perspective drawing of a gaming device 700 in accordance with the described embodiments. The gaming device 700 is example of what can be considered a "thick-client." Typically, a thick-client is configurable to communicate with one or more remote servers but provides game play, such as game outcome determination, independent of the remote servers. In addition, a thick-client can be considered as such because it includes cash handling capabilities, such as peripheral devices for receiving cash, and a secure enclosure within the device for storing the received cash. In contrast, thin-client device, such as a mobile gaming device, may be more dependent on a remote server to provide a component of the game play on the device, such as game outcome determination, and/or may not include peripheral devices for receiving cash and an associated enclosure for storing it.

Many different configurations are possible between thick and thin clients. For instance, a thick-client device, such as 700, deployed in a central determination configuration, may receive game outcomes from a remote server but still provide cash handling capabilities. Further, the peripheral devices can vary from gaming device to gaming device. For instance, the gaming device 700 can be configured with electro-mechanical reels to display a game outcome instead of a video display, such as 710. Thus, the features of gaming device 700 are described for the purposes of illustration only and are not meant to be limiting.

The gaming device 700 can include a main cabinet 702. The main cabinet 702 can provide a secure enclosure that prevents tampering with the device components, such as a game controller (not shown) located within the interior of the main cabinet and cash handing devices including a coin acceptor 720, a ticket printer 726 and a bill acceptor 718. The main cabinet can include an access mechanism, such as door 704, which allows an interior of the gaming device 700 to be accessed. The actuation of the door 704 can be controlled by a locking mechanism, such as lock 716. The lock 716, the door 704 and the interior of the main cabinet 702 can be monitored with security sensors for detecting whether the interior has been accessed. For instance, a light sensor can be provided to detect a change in light-level in response to the door 704 being opened.

The interior of the main cabinet 700 can include additional secure enclosure, which can also be fitted with locking mechanisms. For instance, the game controller can be secured within a separate locked enclosure. The separate locked enclosure for the game controller may allow maintenance functions to be performed on the gaming device, such as emptying a drop box for coins, emptying a cash box or replacing a device, while preventing tampering with the game controller. Further, in the case of device with a coin acceptor, 720, the separate enclosure can protect the electronics of the game controller from potentially damaging coin dust.

A top box 706 can be mounted to the top of the main cabinet 702. A number of peripheral devices can be coupled to the top box 706. In FIG. 9, a display device 708 and a candle device 714 are mounted to the top box 706. The display device 708 can be used to display information associated with game play on the gaming device 700. For instance, the display device 708 can be used to display a bonus game presentation associated with the play of a wager-based game (One or more bonus games are often features of many wager-based games). In another example, the display device 708 can be used to display information associated with a progressive game, such as one or more progressive jackpot amounts. In yet another example, the display device 708 can be used to display an attract feature that is intended to draw a potential player's attention to the gaming device 700 when it is not in use.

The candle device 714 can include a number of lighting elements. The lighting elements can be lit in different patterns to draw attention to the gaming device. For instance, one lighting pattern may indicate that service is needed at the gaming device 700 while another light pattern may indicate that a player has requested a drink. The candle device 714 is typically placed at the top of gaming device 700 to increase its visibility. Other peripheral devices, including custom bonus devices, such as reels or wheels, can be included in a top box 706 and the example in FIG. 9 is provided for illustrative purposes only. For instance, some of the devices coupled to the main cabinet 702, such as printer 726, can be located in a different top box configuration.

The gaming device 700 provides a player interface that allows the play of a game, such as wager-based game. In this embodiment, the player interface includes 1) a primary video display 710 for outputting video images associated with the game play, 2) audio devices, such as 722, for outputting audio content associated with game play and possibly casino operations, 3) an input panel 712 for at least providing game play related inputs and 4) a secondary video display 708 for outputting video content related to the game play (e.g., bonus material) and/or the casino enterprise (e.g., advertising). In particular embodiments, one or both of the video displays, 708 and 710, can be equipped with a touch screen sensor and associated touch screen controller, for detecting touch inputs, such as touch inputs associated with the play of a game or a service window output to the display device.

The input panel 712 can include a number of electro-mechanical input buttons, such as 730, and/or touch sensitive surfaces. For instance, the input panel can include a touch screen equipped video display to provide a touch sensitive surface. In some embodiments, the functions of the electro-mechanical input buttons can be dynamically reconfigurable. For instance, the function of the electro-mechanical input buttons may be changed depending on the game that is being played on the gaming device. To indicate function changes, the input buttons can each include a configurable display, such as an e-ink or a video display for indicating the function of button. The output of the configurable display can be adjusted to account for a change in the function of the button.

The gaming device 700 includes a card reader 728, a printer 726, a coin acceptor 720, a bill and/or ticket acceptor 720 and a coin hopper (not shown) for dispensing coins to a coin tray 732. These devices can provide value input/output capabilities on the gaming device 700. For instance, the printer 726 can be used to print out tickets redeemable for cash or additional game play. The tickets generated by printer 726 as well as printers on other gaming devices can be inserted into bill and ticket acceptor 718 to possibly add credits to the gaming device 700. After the ticket is authenticated, credits associated with the ticket can be transferred to the gaming device 700.

The device 718 can also be used to accept cash bills. After the cash bill is authenticated, it can be converted to credits on the gaming device and used for wager-based game play. The coin acceptor 720 can be configured to accept coins that are legal tender or tokens, such as tokens issued by a casino enterprise. A coin hopper (not shown) can be used to dispense coins that are legal tender or tokens into the coin tray 732.

The various aspects, embodiments, implementations or features of the described embodiments can be used separately or in any combination. Various aspects of the described embodiments can be implemented by software, hardware or a combination of hardware and software. The computer readable medium is any data storage device that can store data which can thereafter be read by a computer system. Examples of the computer readable medium include read-only memory, random-access memory, optical media (e.g., CD-ROMs, DVDs), magnetic tape, solid state drives (e.g., flash drives) and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

While the embodiments have been described in terms of several particular embodiments, there are alterations, permutations, and equivalents, which fall within the scope of these general concepts. It should also be noted that there are many alternative ways of implementing the methods and apparatuses of the present embodiments. It is therefore intended that the following appended claims be interpreted as including all such alterations, permutations, and equivalents as fall within the true spirit and scope of the described embodiments.

What is claimed is:

1. A multi-layer display assembly for providing a 3D-like image on an electronic gaming machine for a wager-based game, the display assembly comprising:
 a plurality of layers including:
  a first display panel;
  a second display panel substantially parallel to and behind the first display panel; and
  an interstitial component, wherein the interstitial component is positioned between the first and second display panels, and is substantially parallel to each of the first and second display panels;
an acousto-optical modulator comprising a piezoelectric transducer coupled to the interstitial component for mitigating moire interference; and
an acoustic absorber coupled to the interstitial component opposite from the piezoelectric transducer.

2. The multi-layer display assembly of claim 1, wherein the interstitial component is at least semi-transparent.

3. The multi-layer display assembly of claim 1, wherein the piezoelectric transducer is configured to convert electrical energy into acoustic energy.

4. The multi-layer display assembly of claim 1, wherein the piezoelectric transducer is configured to vibrate and create sound waves in the component to which it is attached.

5. The multi-layer display assembly of claim 1, wherein the display panels are liquid crystal display panels.

6. The multi-layer display assembly of claim 1, wherein the display assembly is a backlit display assembly.

7. The multi-layer display assembly of claim 1, wherein the acousto-optical modulator is a first acousto-optical modulator, the multi-layer display assembly further comprising:
a second acousto-optical modulator coupled to at least one of the plurality of layers for mitigating moire interference.

8. The multi-layer display assembly of claim 1, wherein vibrations produced by the piezoelectric transducer can be adjusted.

9. The multi-layer display assembly of claim 2, wherein the interstitial component is glass.

10. The multi-layer display assembly of claim 3, wherein the glass is fully transparent.

11. The multi-layer display assembly of claim 1, wherein the interstitial component has substantially a same length and width as the first display panel.

12. A method of making a multi-layer display assembly useable in an electronic gaming machine for a wager-based game, the method comprising:
providing a first display panel, a second display panel, and an interstitial component, wherein the first display panel is positioned in front of and substantially parallel to the second display panel, the first and second display panels are spaced apart from one another, and the interstitial component is positioned between the first and second display panels, and is substantially parallel to each of the first and second display panels;
attaching an acousto-optical modulator for mitigating moiré interference onto an edge of the interstitial component, the acousto-optical modulator comprising a piezoelectric transducer, and
attaching an acoustic absorber onto an edge of the interstitial component opposite from the piezoelectric transducer.

13. The method of claim 12, wherein the interstitial component is at least semi-transparent.

14. The method of claim 12, further comprising adjusting the piezoelectric transducer to mitigate moiré interference.

15. A method of adjusting a multi-layer display assembly in an electronic gaming machine for a wager-based game, the method comprising:
providing the electronic gaming machine with the multi-layer display assembly, wherein the multi-layer display assembly includes an acousto-optical modulator attached to a first edge of an interstitial component, an acoustic absorber attached to a second edge of the interstitial component, the second edge being opposite the first edge, wherein the interstitial component is positioned between the first and second display panels, and is substantially parallel to each of the first and second display panels;
turning on the multi-layer display;
determining whether a moiré pattern can be detected after the display assembly is turned on; and
adjusting the acousto-optical modulator if a moiré pattern is detected.

16. The method of claim 15, wherein the acousto-optical modulator comprises a piezoelectric transducer.

17. The method of claim 16, wherein the interstitial component is at least semi-transparent.

18. The method of claim 16, wherein the interstitial component is glass.

19. The method of claim 16, wherein the display panels are liquid crystal display panels.

20. The method of claim 16, wherein adjusting the acousto-optical modulator includes adjusting a vibration of the piezoelectric transducer.

* * * * *